United States Patent
Fujii (10) Patent No.: US 7,967,047 B2
(45) Date of Patent: Jun. 28, 2011

(54) FILM SPLICER

(75) Inventor: Nobuaki Fujii, Shimonoseki (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 295 days.

(21) Appl. No.: 11/903,098

(22) Filed: Sep. 20, 2007

(65) Prior Publication Data
US 2008/0026212 A1 Jan. 31, 2008

Related U.S. Application Data

(62) Division of application No. 11/063,519, filed on Feb. 23, 2005, now Pat. No. 7,294,381.

(30) Foreign Application Priority Data

Feb. 24, 2004 (JP) ................................ 2004-048139

(51) Int. Cl.
*B31F 5/06* (2006.01)
*B65H 21/00* (2006.01)
*B65H 69/06* (2006.01)
*G03D 15/00* (2006.01)

(52) U.S. Cl. ........ 156/505; 156/502; 156/504; 156/510; 156/516; 156/518

(58) Field of Classification Search ................. 156/502, 156/504, 505, 510, 516, 518
See application file for complete search history.

(56) References Cited

U.S. PATENT DOCUMENTS

| | | | | |
|---|---|---|---|---|
| 3,382,131 A | * | 5/1968 | Morganroth | 156/505 |
| 5,354,408 A | * | 10/1994 | Otomine et al. | 156/505 |
| 2005/0186418 A1 | | 8/2005 | Fujii | |

FOREIGN PATENT DOCUMENTS

| | | |
|---|---|---|
| JP | 4211771 A | 7/1942 |
| JP | 2002028981 A | 1/2002 |

OTHER PUBLICATIONS

Machine Translation of Abstract, Claims and Detailed Description of JP-A-2002-028981; Jan. 29, 2002.

* cited by examiner

*Primary Examiner* — Mark A Osele
*Assistant Examiner* — Christopher C Caillouet
(74) *Attorney, Agent, or Firm* — The Webb Law Firm (57) ABSTRACT

A film splicer including a base body on which two films to be spliced are aligned such that splicing ends thereof make contact with each other, an adhesive tape applied to the splicing ends of the films to join them, and a splicer arm that is folded against the base body to bore sprocket holes by punching members and to cut the adhesive tape by cutting members to a length corresponding to the length in the width direction of the films, wherein the cutting members comprise punches capable of punching out both the adhesive tape and excessive edge areas in the width direction of the films and that are formed with tapered portions having an angle relative to a cutting direction that extends in the longer direction of the films, the tapered portions being formed at both end areas in the cutting direction, whereby edge areas in the width direction of the films spliced together are free of steps.

3 Claims, 10 Drawing Sheets

PRIOR ART

Fig. 10

PRIOR ART

Fig. 11   PRIOR ART

FILM SPLICER

CROSS-REFERENCE TO RELATED APPLICATION

This application is a division of U.S. patent application Ser. No. 11/063,519 filed Feb. 23, 2005, entitled "Spliced Film Carrier Tape", which is incorporated by reference herein in its entirety.

BACKGROUND OF THE INVENTION

1. Field of the Invention

The present invention relates to a film splicer for joining ends of films to be spliced with an adhesive tape, and to a film carrier tape for mounting electronic components that is spliced by the film splicer (such film carrier tapes including TAB (tape automated bonding) tapes, COF (chip on film) tapes, BGA (ball grid array) tapes, CSP (chip size package) tapes, ASIC (application specific integrated circuit) tapes, 2-metal (double-sided wiring) tapes and multilayer wiring tapes). More particularly, the present invention pertains to prevention of steps at edges in the width direction of spliced films. Herein, the term "film carrier tape(s) for mounting electronic components" comprehends those carrying electronic components as well as film carrier tapes prior to the mounting.

2. Description of Related Art

Various film splicers have been proposed and been in practical use for splicing the ends of two films with an adhesive tape (see, for example, JP-A-2002-28981). For example, such film splicers are employed to splice film carrier tapes for the mounting of electronic components (hereinafter, sometimes referred to as "film carrier tapes") or to splice a film carrier tape and a lead tape by joining the ends thereof with an adhesive tape.

It is common practice that a film carrier tape having a length of 110 m per lot is cut into 20-40 m long tapes depending on user specification, and lead tapes are spliced with the tip and end of each tape to wind the tape around a reel.

Moreover, when any defective part is found during production of film carrier tapes, the area corresponding to the defective part is cut off and the resultant ends of the film carrier tapes are spliced.

Figure 9:
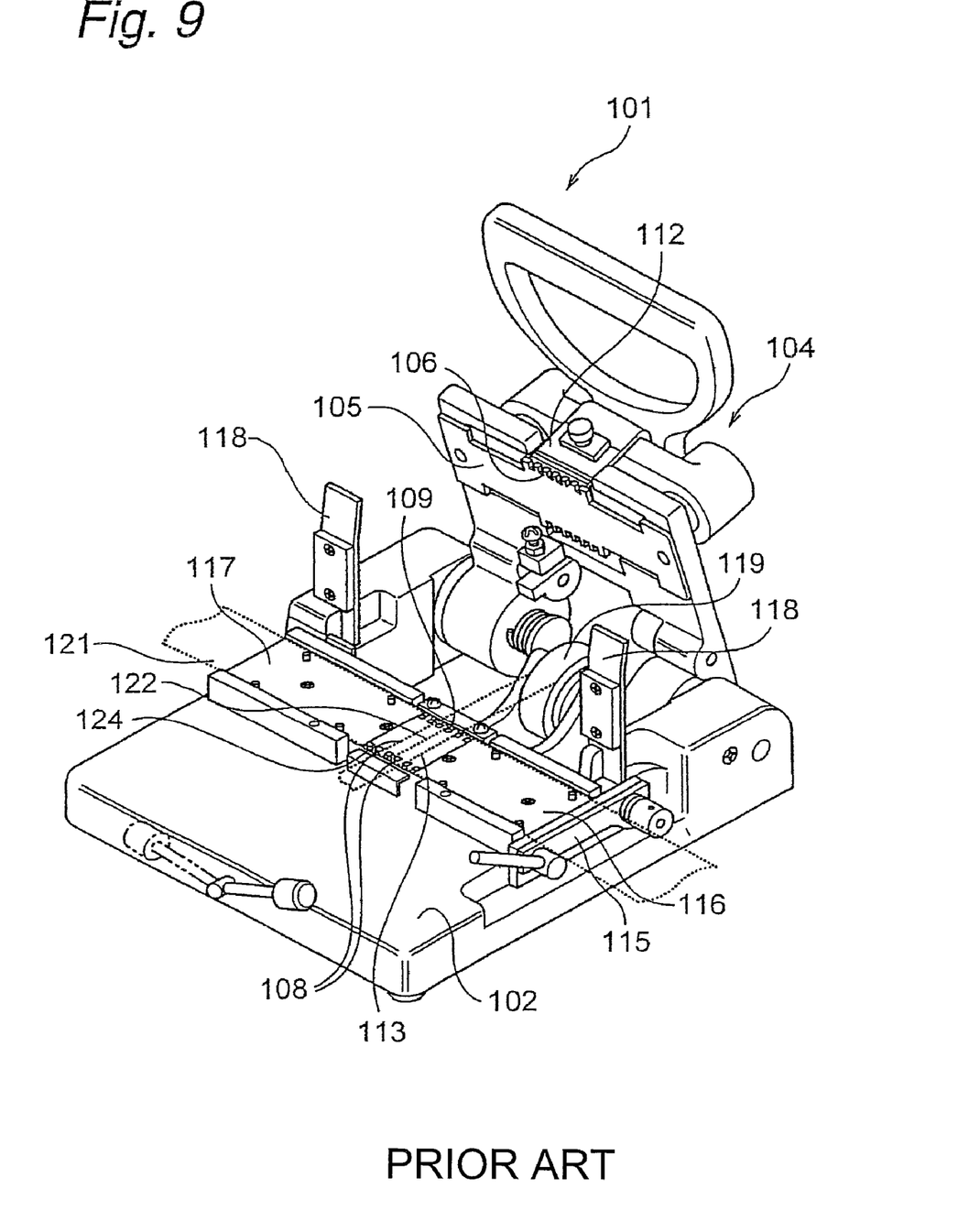
FIG. 9 is a view illustrating a conventional film splicer.
Figure 10:
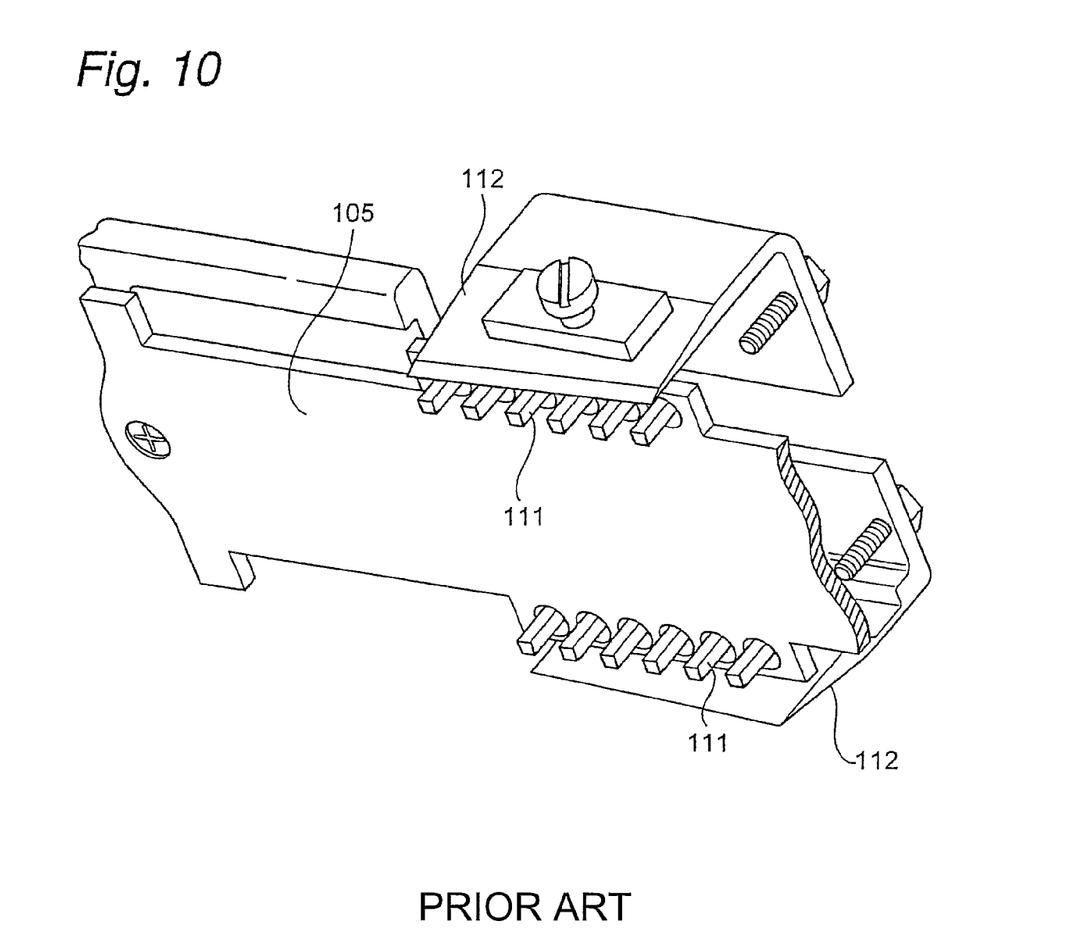
FIG. 10 is a view illustrating punching members and adhesive tape-cutting blades attached to the film splicer of FIG. 9.

FIG. 9 shows an example of the conventional film splicer, and FIG. 10 illustrates punching members and adhesive tape-cutting blades attached to the splicer. The illustrated film splicer 101 has the following mechanism. Two film carrier tapes 121 having been trimmed by a cutter 115 to remove unnecessary portions are guided by a pair of guide members 116 and 117, and splicing ends 122 are butted together on a film splicing table 113 arranged on a base body 102. Film pressing members 118 are folded on the film carrier tapes 121 to hold the same. Subsequently, an adhesive tape 124 is drawn from a roll 119 fitted in the base body 102 and is applied to splice the splicing ends 122 of the film carrier tapes 121.

Thereafter, a splicer arm 104 whose base end is supported by a shaft to the base body 102 to allow rotation toward and away from the base body 102, is pressed down against the upper surface of the base body 102. As a result, a pressing plate 105 fitted to the lower surface side of the splicer arm 104 presses the film carrier tapes 121 and the adhesive tape 124 against the film splicing table 113. At the same time, a pair of punching members 111 as illustrated in FIG. 10 is protruded downward through punching member penetration holes 106 of the pressing plate 105. The punching members penetrate the adhesive tape 124 and are fitted in punching member fitting holes 108 formed in the film splicing table 113, with formation of sprocket holes.

When the splicer arm 104 is pressed down against the upper surface of the base body 102, a pair of adhesive tape-cutting blades 112 as illustrated in FIG. 10 is protruded downward from the surface of the pressing plate 105 and fits with the edges 109 in the width direction of the film splicing table 113 to cut the adhesive tape 124 to the length in the width direction of the film carrier tapes 121.

However, a width of the insulating layer (e.g., polyimide film) of the film carrier tape varies by about ±100 μm. Accordingly, it is often the case that the widths of such film carrier tapes do not correspond to a predetermined distance between a pair of the adhesive tape-cutting blades 112, and insufficient or excessive tape widths result.

When the widths of the film carrier tapes are larger than the distance between the adhesive tape-cutting blades, it is required that the cutting blades will cut the adhesive tape and also the excessive edge areas in the width direction of the film carrier tapes. However, the conventional cutting blades (cutters) 112 with a sharp tip sometimes fail to cut film carrier tapes such as TAB tapes.

Figure 11:
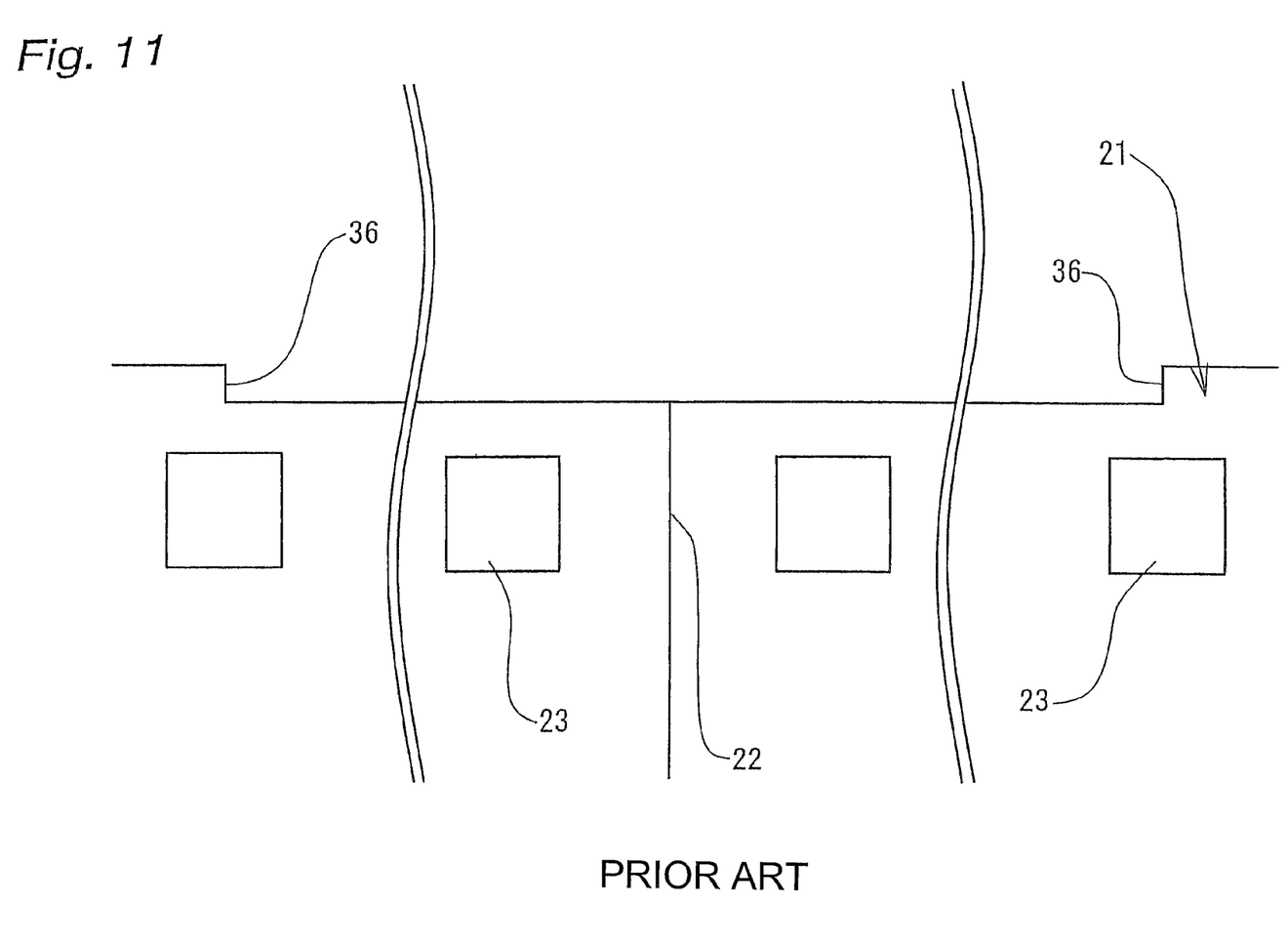
FIG. 11 is a view illustrating an edge portion in the width direction of spliced films that are cut according to the conventional art.

Even if the cutting succeeds, the cutting blades will cut off the excessive edge areas in the width direction of the film carrier tapes 21 to leave the concave edges with formation of right-angled steps 36 as illustrated in FIG. 11.

When the widths of the film carrier tapes are smaller than the distance between the adhesive tape-cutting blades, the adhesive tape will be cut outside the edges in the width direction of the film carrier tapes. Consequently, the adhesive tape will protrude from the edges in the width direction of the film carrier tapes to form convex steps.

The steps formed at the edges of the film carrier tapes as described above cause troubles in the conveyance of the film carrier tapes. For example, when the film carrier tapes are moved in the mounting process of electronic components such as IC tips, the steps are caught in guide members of approximately the same width as the film carrier tapes that regulate the conveyance position of the tapes.

The present invention has been made to solve the aforesaid problems of the background art. It is therefore an object of the invention to provide a film splicer that is capable of cutting an adhesive tape with edge areas in the width direction of films such as film carrier tapes and that does not leave steps at the edges of the films spliced together. The invention has another object of providing a film carrier tape free from such steps.

SUMMARY OF THE INVENTION

The present invention achieves the above objects by providing a film splicer comprising:

a base body on which two films to be spliced are aligned at predetermined positions such that splicing ends thereof make contact with each other;

a splicer arm that is supported by a shaft to a base end portion of the base body and is rotatable toward and away from the base body;

a pressing plate provided on the lower surface side of the splicer arm, the pressing plate being capable of pressing an adhesive tape and the films when the splicer arm is folded on the films on the base body, the adhesive tape being applied over the splicing ends of the films so as to splice these ends;

a pair of punching members that are protruded downward from the pressing plate to penetrate the adhesive tape to bore sprocket holes when the splicer arm is folded on the films on the base body; and a pair of cutting members that are protruded downward from the pressing plate to cut the adhesive tape to a length in the width direction of the films when the splicer arm is folded on the films on the base body;

wherein the cutting members are punches that are capable of punching out both the adhesive tape and excessive edge areas in the width direction of the films and that are formed with tapered portions having an angle relative to a cutting direction that extends in the longer direction of the films, the tapered portions being formed at both end areas in the cutting direction.

The above constitution according to the present invention employs punches as the cutting members to punch out the adhesive tape. That is, the apparatus of the invention cuts the adhesive tape by a punching die that has punches and die apertures fitting with the punches. This die can cut the adhesive tape to a length corresponding to the length in the width direction of the film. This constitution permits cutting such that even when films, such as film carrier tapes for mounting electronic components, have rather larger widths than the distance between a pair of the cutting members, the adhesive tape and the excessive edge areas in the width direction of the films may be punched out.

Further, when the film widths are rather larger than the distance between the cutting members, the cutting members (punches) cut the adhesive tape and the excessive edge areas in the width direction of the films in a manner such that the end areas on both sides of the regions to be removed are cut by the tapered portions formed at both end areas in the cutting direction of the punches. Accordingly, the cutting leaves smooth transition from the cut sides to the adjacent sides of the films, tapered at the angle of the tapered portions. No right-angled steps are formed. Accordingly, the films may be spliced without steps on the edge sides.

Furthermore, the cutting members may be adjusted to be rather narrowly spaced than the average width of the films. Therefore, even if the films have a width rather smaller than the distance between the cutting members, protrusion of the adhesive tape from the films may be reduced.

As such, the film splicer of the present invention can cut (punch out) an adhesive tape together with films and does not leave steps at the edges of the films spliced together.

A film carrier tape for mounting electronic components according to the present invention comprises a plurality of film carrier tapes spliced together with an adhesive tape over end portions of adjacent film carrier tapes, wherein the film carrier tape has concave edges whose both ends in a cutting direction that extends in the longer direction of the film are tapered at an angle relative to the cutting direction, the concave edges being created by cutting the adhesive tape and both edge areas in the width direction of the film carrier tapes.

In the above constitution according to the present invention, film carrier tapes are spliced together by use of the above-described film splicer. Accordingly, the film carrier tapes spliced together have smooth transition from the cut sides to the adjacent sides of the films, with no right-angled steps being formed between the cut sides and the adjacent sides of the films, and also at the butt joint of the splicing film ends.

Therefore, the film carrier tape of the invention may be stably conveyed without being caught in guide members that regulate the conveyance position of the film carrier tapes in the process of mounting electronic components.

As such, the film carrier tape for mounting electronic components according to the present invention permits stable conveyance.

DETAILED DESCRIPTION OF THE INVENTION

Figure 1:
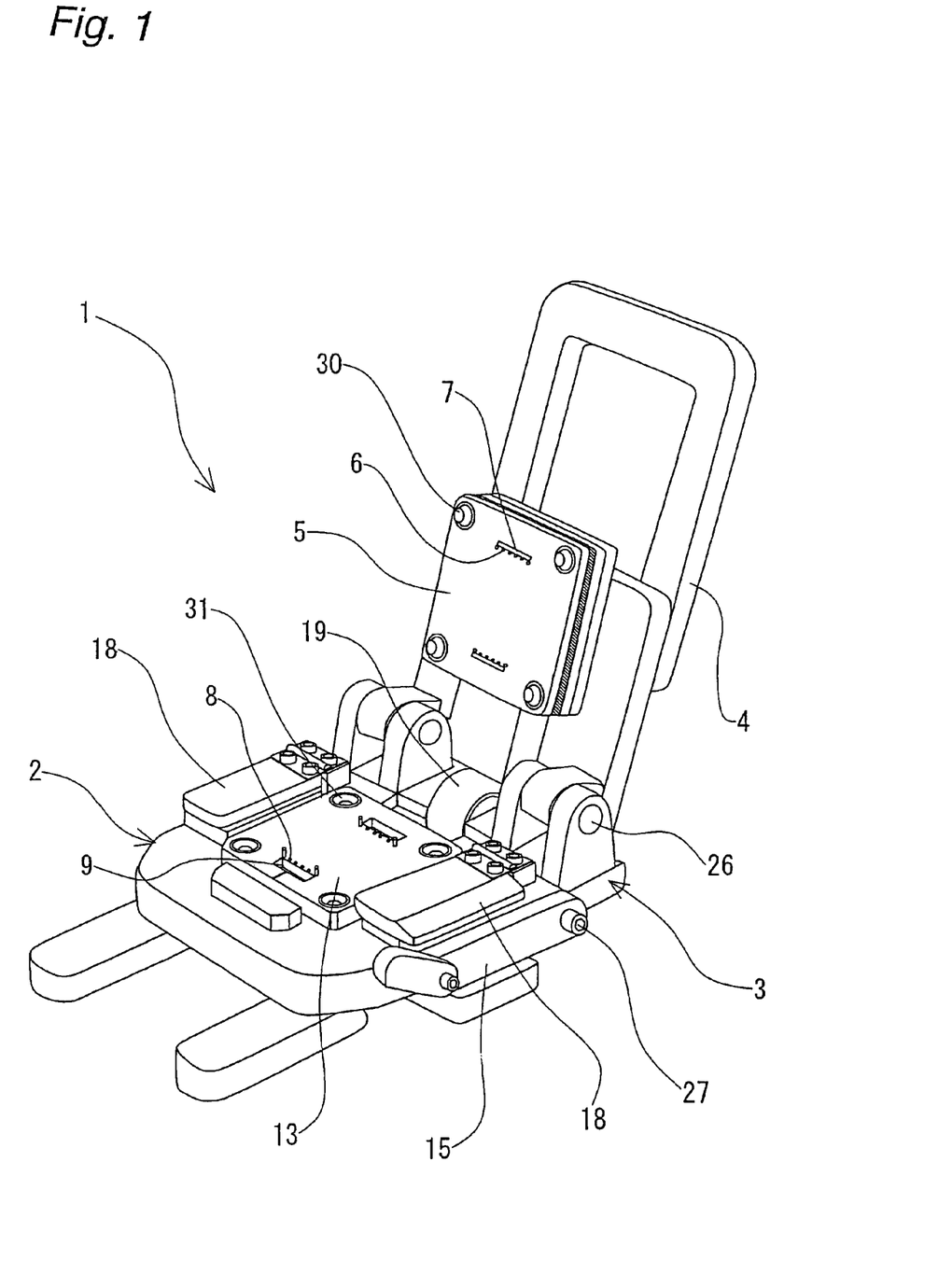
FIG. 1 is a perspective view illustrating the film splicer according to an embodiment of the invention.
Figure 2:
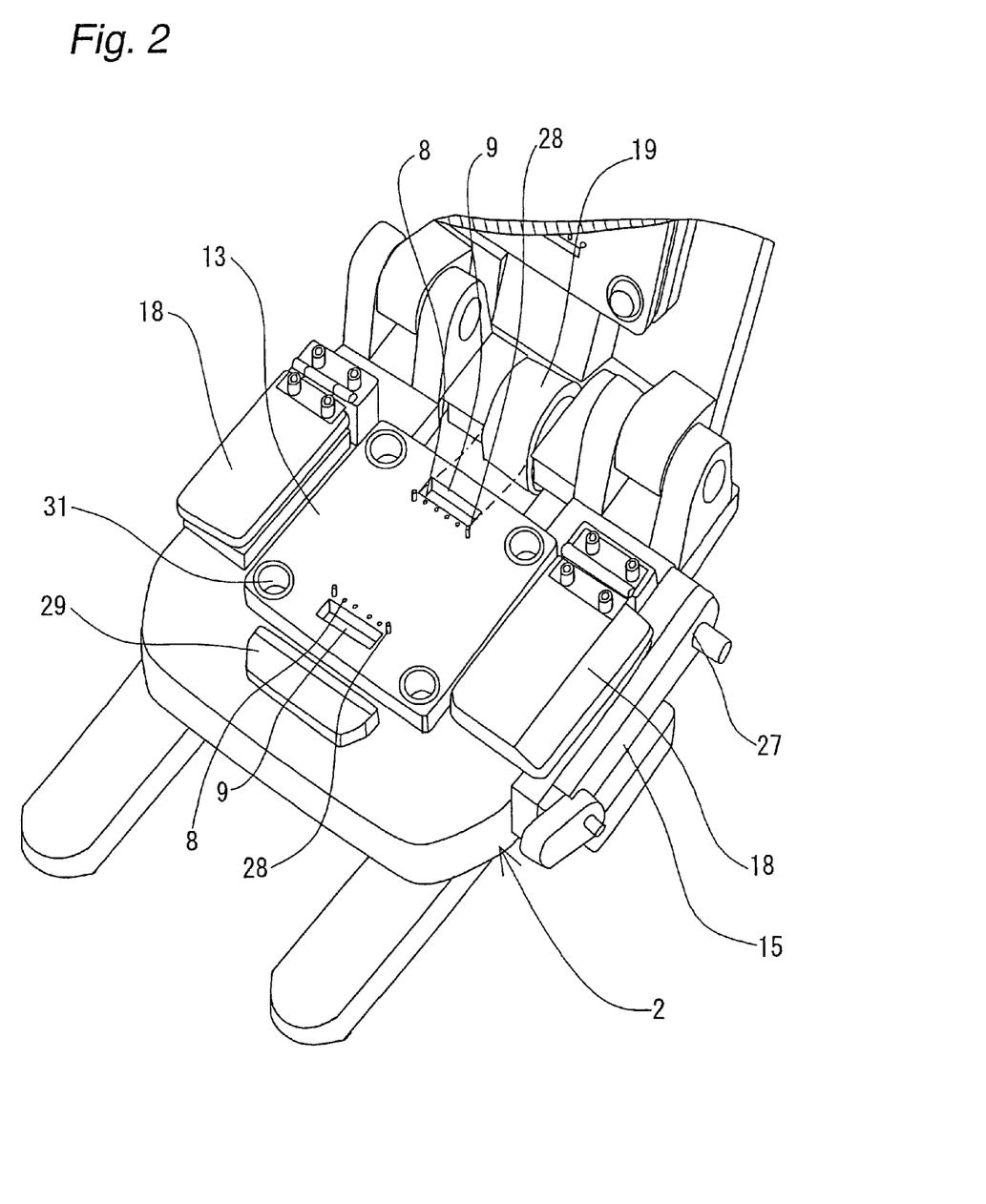
FIG. 2 is a perspective view of a base body of the film splicer illustrated in FIG. 1.
Figure 3:
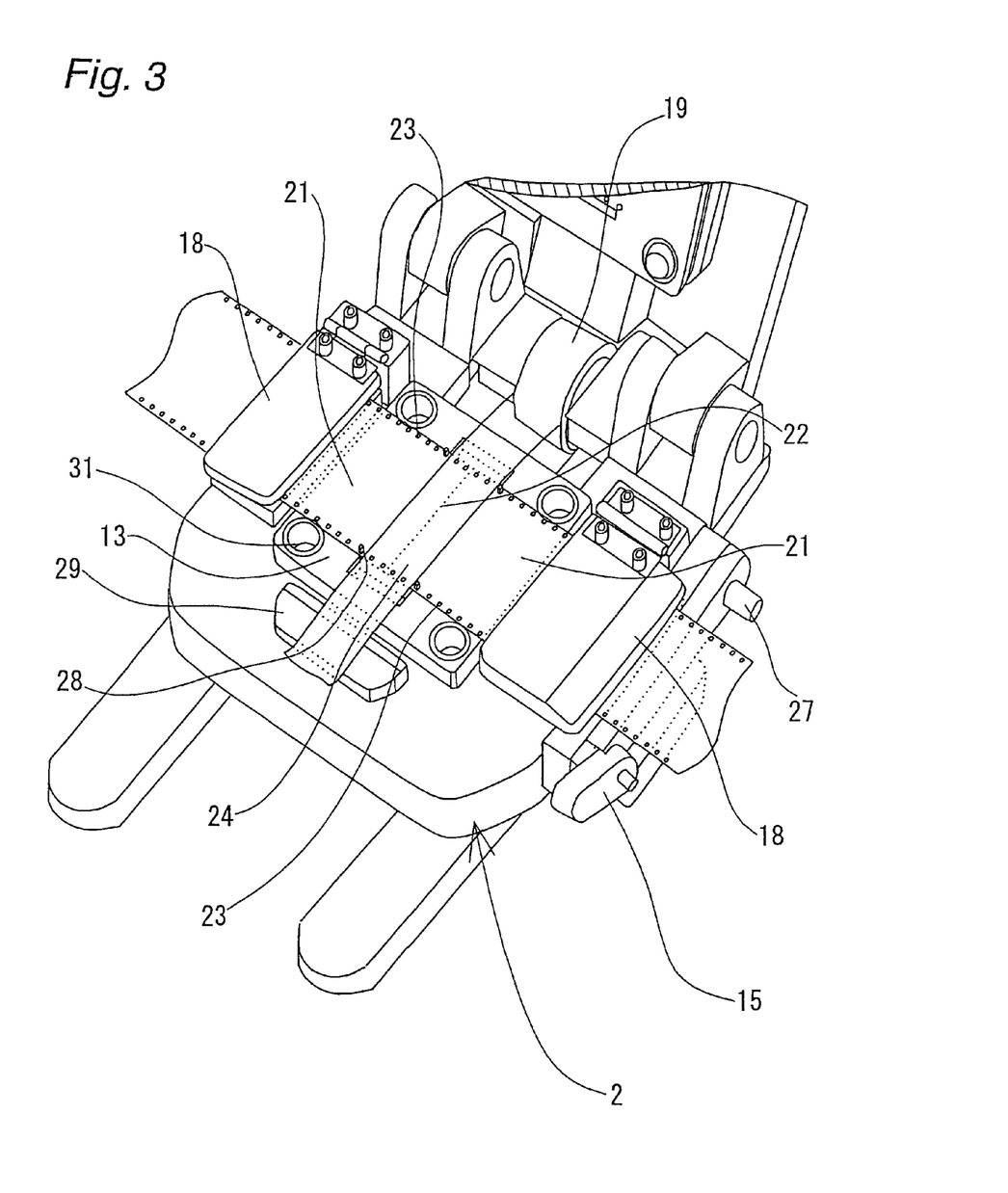
FIG. 3 is a perspective view of the film splicer shown in FIG. 1, in which two film carrier tapes are butted together on the base body and an adhesive tape is applied over the joint.

Hereinbelow, embodiments of the present invention will be described with reference to the drawings. FIG. 1 is a perspective view illustrating the film splicer according to an embodiment of the invention. FIG. 2 is a perspective view of a base body of the film splicer illustrated in FIG. 1. FIG. 3 is a perspective view of the film splicer shown in FIG. 1 in which two film carrier tapes are butted together on the base body and an adhesive tape is applied over the joint.

A film splicer 1 illustrated in FIGS. 1 to 3 according to the present invention is designed to splice film carrier tapes together or a film carrier tape and a lead tape by joining the ends thereof with an adhesive tape. The following description will be dedicated to explaining an embodiment in which film carrier tapes for mounting electronic components are spliced. Similarly to the constitution in the prior art, the film splicer 1 includes a base body 2 on which two film carrier tapes 21 to be spliced are aligned at predetermined positions such that their splicing ends 22 make contact with each other. The splicer further includes a splicer arm 4 that is pivotally supported by a pivot shaft 26 at a base end portion 3 of the base body 2 such that the splicer arm is rotatable toward and away from the base body 2.

A cutter 15 is provided at a side of the base body 2 and is pivotally supported by a shaft at an end part 27. The cutter 15 trims unnecessary portions of the film carrier tapes 21 by being moved down in relation to the base body 2.

The two film carrier tapes 21 trimmed as described above are aligned at predetermined positions on the film splicing table 13 such that their splicing ends 22 make contact with each other, as illustrated in FIG. 3. The film carrier tapes 21 are then held by vertically rotatable film pressing members 18 adjacent to the film splicing table 13. Guide members (not shown) under the pressing members 18 control the movement of the film carrier tapes in the width direction. Positioning pins 28 provided on the film splicing table 13 are engaged with sprocket holes 23 to align and fix the tapes to predetermined positions.

An adhesive tape 24 that is wound around a roll 19 fitted to the base body 2 is drawn to a temporal tape catcher 29 and applied to the film carrier tapes 21 positioned as described above such that the splicing ends 22 of the film carrier tapes 21 are spliced. The adhesive tape 24 may be a polyimide-based tape.

In the state as described above, the splicer arm 4 is pressed against the upper surface of the base body 2. On the lower surface side of the splicer arm 4, a pressing plate 5 is equipped such that it is slidable several mm in any directions parallel to the splicer arm 4 and is spaced from the splicer arm 4 by the spring force of spring members.

Figure 4:
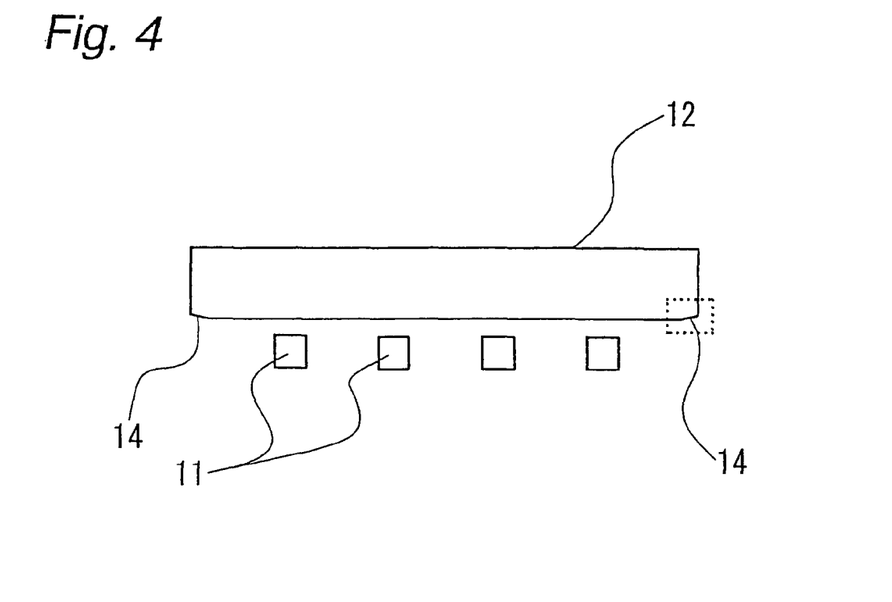
FIG. 4 is a bottom view of a cutting member and boring punch members fitted to a splicer arm.

A pair of punching members 11 for boring sprocket holes 23 and a pair of cutting members 12 for cutting the adhesive tape 24 to a length corresponding to the width of the film carrier tapes 21 are fitted through holders (not shown) to a plate on the side of the back surface of the pressing plate 5 (namely, on the side of the splicer arm). These punching members 11 and cutting members 12 are as illustrated in FIG. 4 (bottom view).

When the splicer arm 4 is folded on the upper surface of the base body 2, the pressing plate 5 slides with wiggling movements in the surface direction so as to correctly locate and fit four positioning protrusions 30 on the four corners of the pressing plate 5 in four positioning apertures 31 on the four corners of the film splicing table 13. In this state, the pressing plate 5 presses the adhesive tape 24 on the splicing ends 22 of the film carrier tapes 21 aligned on the film splicing table 13, and the film carrier tapes 21.

Consequently, the splicer arm 4 and the pressing plate 5 are narrowly spaced against the resistance of spring members (not shown) between them. As a result, the punching members 11 and the cutting members 12 are protruded downward from the pressing plate 5 through a pair of punching member penetration holes 6 and a pair of cutting member penetration holes 7 respectively.

The punching members 11 protruded from the pressing plate 5 penetrate the adhesive tape 24 and are fitted in punching member fitting holes 8 formed in the film splicing table 13. Thus, sprocket holes 23 are bored.

Meanwhile, the cutting members 12 protruded from the pressing plate 5 cut the adhesive tape 24 and in some cases excessive edge areas in the width direction of the films near the splicing joint, and are fitted with cutting member fitting holes 9 bored in the film splicing table 13.

As described above, the adhesive tape 24 which has spliced the film carrier tapes 21 are perforated to form the sprocket holes at the splicing joint, and the excess adhesive tape 24 is cut off. When it is necessary that the adhesive tape 24 is applied also on the back surface of the splicing joint, the adhesive tape is applied to both sides of the film carrier tapes, and the sprocket holes are bored and the excess adhesive tapes 24 are cut off to complete the splicing.

Figure 8:
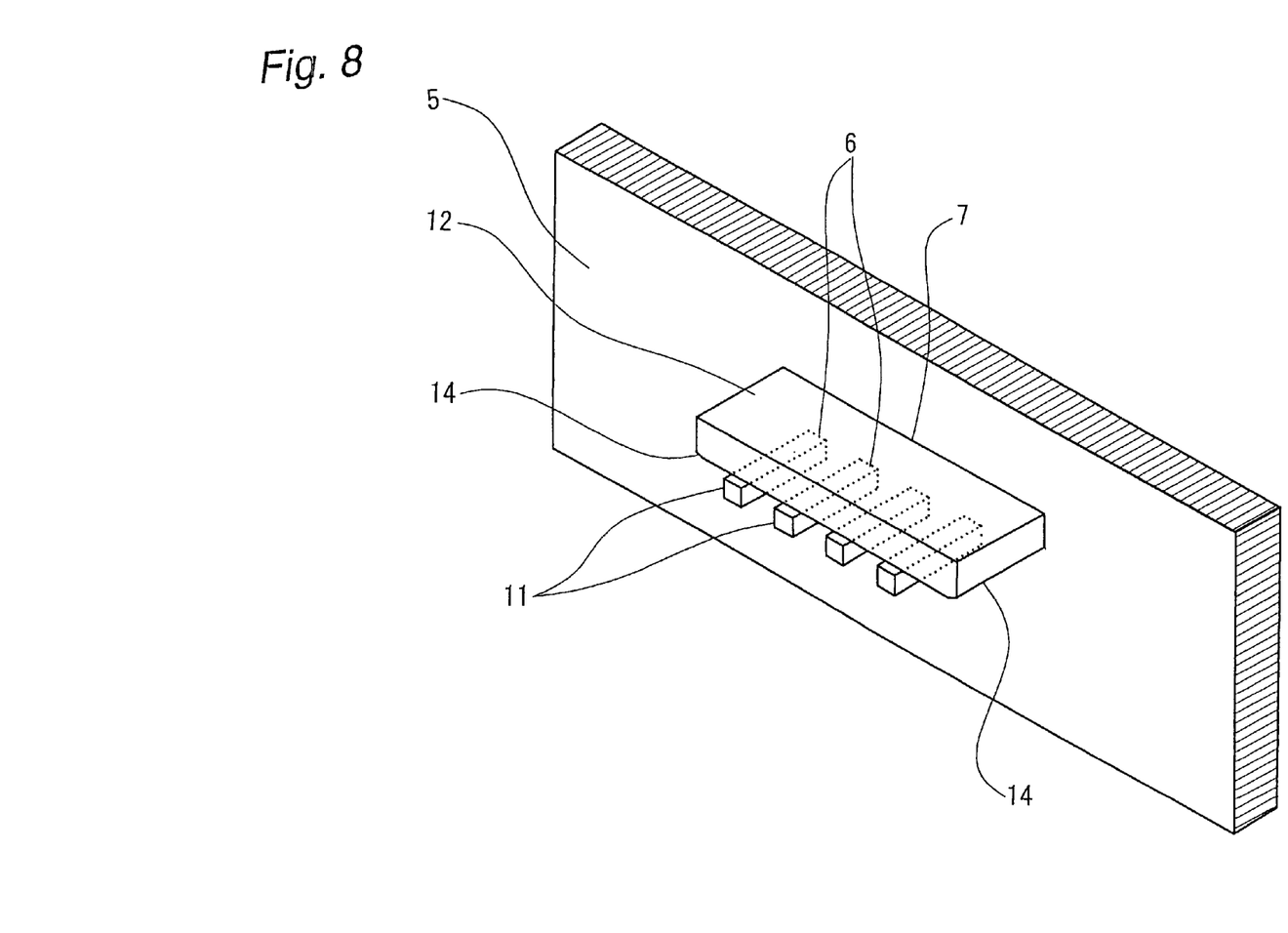
FIG. 8 illustrates a state in which the cutting member and the boring punch members shown in FIG. 4 are protruded from a pressing plate.

The cutting members 12 used in the present embodiment are punches as illustrated in FIGS. 4 and 8, which partly constitute a punching die for punching out the adhesive tape and the edge areas in the width direction of the film carrier tapes. The punching die is capable of satisfactorily cutting the adhesive tape and also the film carrier tapes for mounting electronic components such as TAB tapes or COF tapes which include 10-150 μm thick resin films (e.g., polyimide films) having wiring patterns. The cutting members 12 are longer than the width of the adhesive tape, in the cutting direction that extends in the longer direction of the film carrier tapes. The prior art technology has utilized cutting blades resembling office cutters and has had difficulties in cutting thick polyimide films or the like. On the other hand, the present embodiment uses the punching die described above that makes it possible for the first time to cut thick polyimide films or the like together with the adhesive tape.

Figure 5:
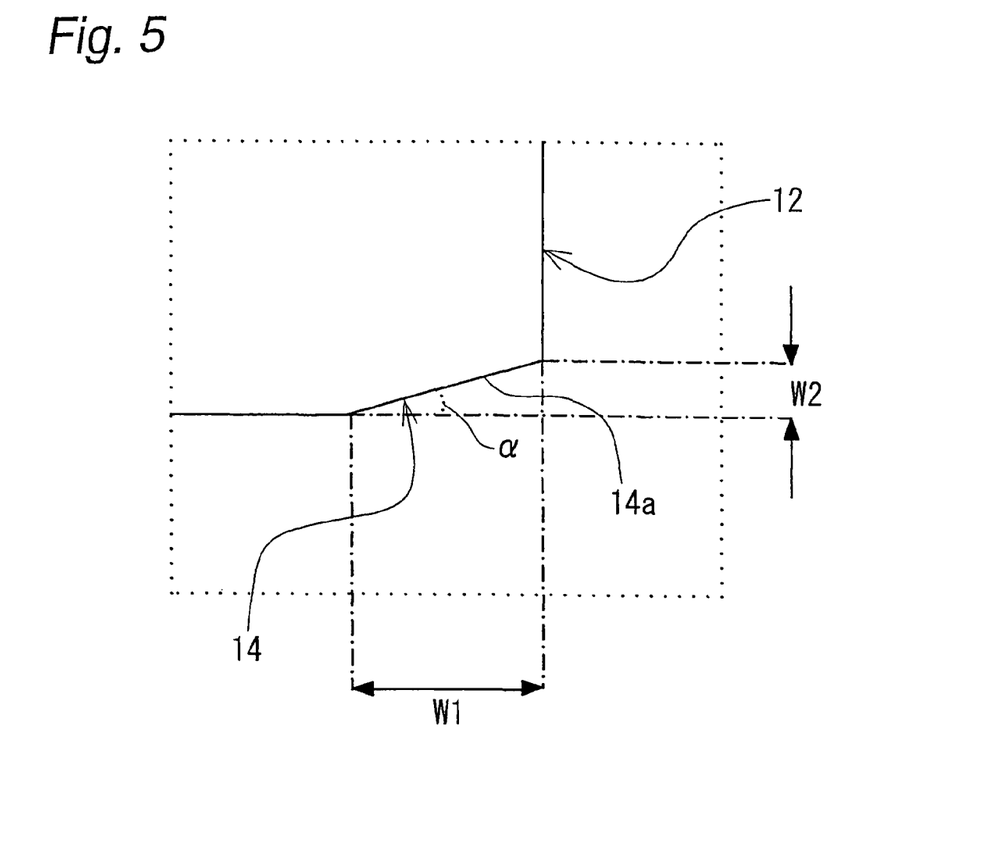
FIG. 5 is an enlarged partial view illustrating the vicinity of a tapered portion of the cutting member shown in FIG. 4.

FIG. 5 is an enlarged view of a part enclosed in a dotted line in FIG. 4. As illustrated, both end areas in the cutting direction of the cutting member 12 are formed with tapered portions 14 that have an angle α relative to the cutting direction extending in the longer direction of the film carrier tape. The tapered portions are formed along the height direction of the cutting member. That is, the tapered portions 14 are formed along the longitudinal direction (height direction) of the punch, and extend from both the ends of the longer side at the bottom of the punching member 11 (FIG. 4). In the present embodiment, the tapered portions 14 are 250 μm in width W1 in the cutting direction and 70 μm in width W2 in the perpendicular depth direction.

Figure 6:
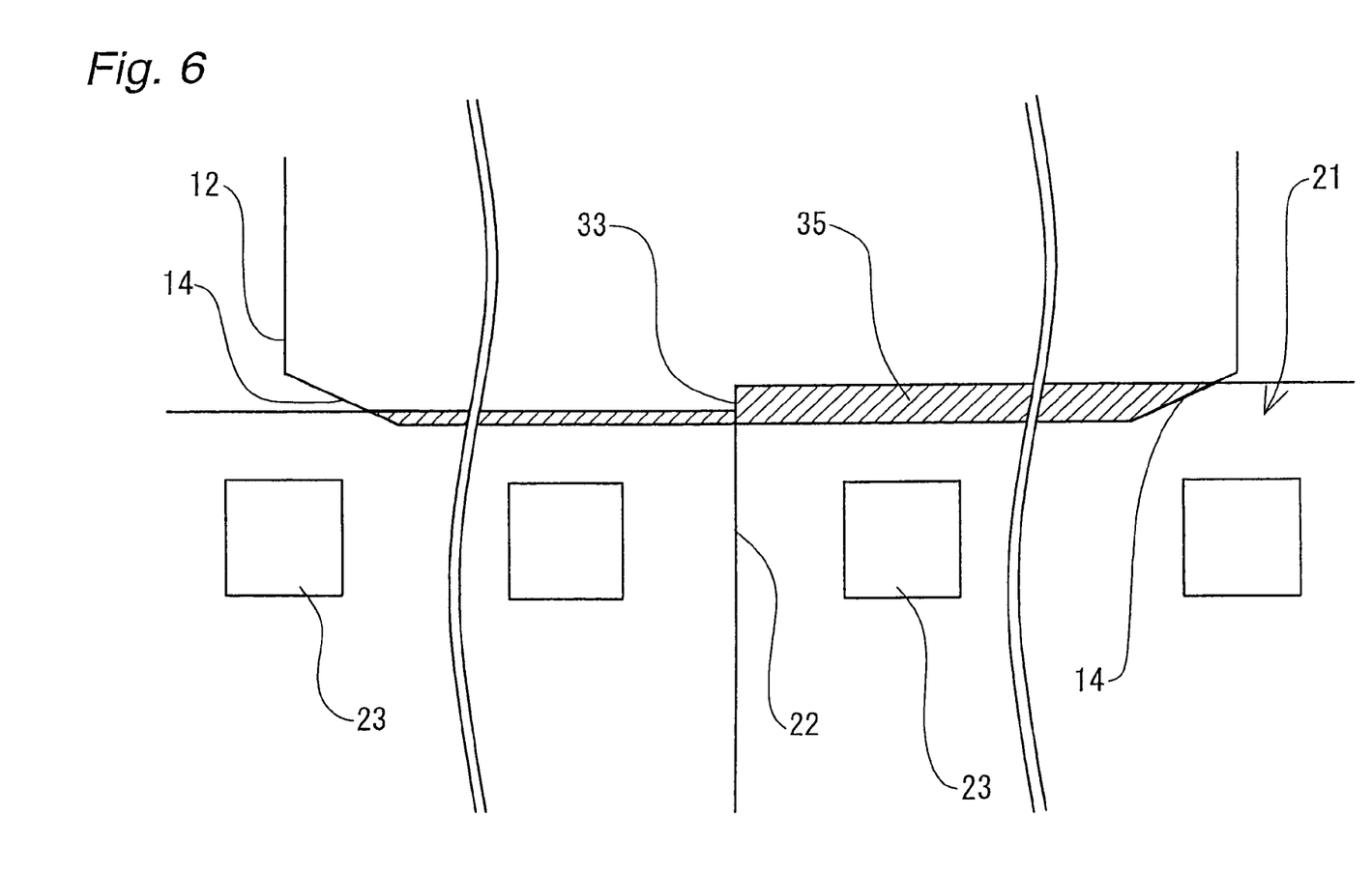
FIG. 6 illustrates location relationship between the cutting member and an edge area in the width direction of the film carrier tapes at the splicing joint.
Figure 7:
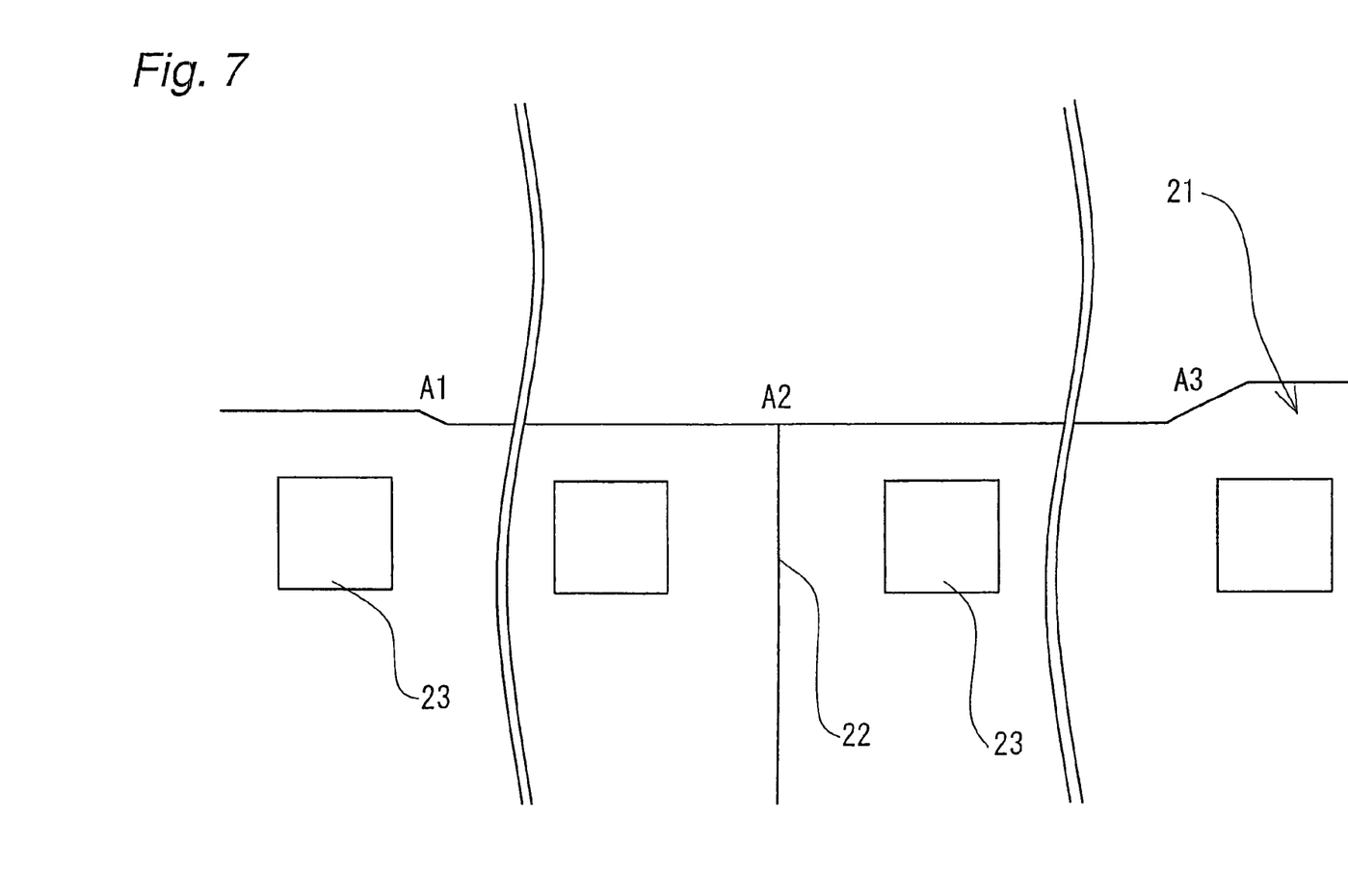
FIG. 7 illustrates the vicinity of the splicing joint between the film carrier tapes after cutting by the cutting member.

FIG. 6 illustrates location relationship between the cutting member and an edge area in the width direction of the film carrier tapes at the splicing joint, and FIG. 7 illustrates the spliced film carrier tapes after cutting by the cutting members (In these figures, the adhesive tape is omitted.). As shown in FIG. 6, the cutting members 12 are arranged such that the tapered portions 14 will intersect with edge sides of the film carrier tapes 21 in order that the tapered portions 14 slightly overlap with edge areas in the width direction of the film carrier tapes. That is, the distance between the cutting members 12 is purposefully adjusted to be smaller than the average width of the film carrier tapes 21.

As a result, the cutting members 12 are positioned to overlap with the edge areas in the width direction of the film carrier tapes 21, and cut off the adhesive tape 24 and film pieces 35 of the film carrier tapes 21 marked with diagonal lines in the figure. Both the end areas in the cutting direction are cut by the tapered portions 14 formed at the corners of the cutting members 12, and provide smooth transition tapering at an angle corresponding to the angle of the tapered portions 14 as shown in FIG. 7.

Without the tapered portions as used in the present embodiment, such cutting members will cut edge areas in the width direction of the film carrier tapes to leave right-angled steps 36 at both ends in the cutting direction as shown in FIG. 11. Moreover, since the film carrier tapes have width variation of about ±100 μm as described above, removal of defective parts from the film carrier tape and splice with the adhesive tape will result in steps 33 between the splicing ends 22 as illustrated in FIG. 6. Cutting such film carrier tapes with cutting members will leave steps attributed to the width difference. Such right-angled steps cause troubles in the conveyance of the film carrier tapes by being caught in guide members that regulate the conveyance position of the film carrier tapes in the mounting of electronic components.

The film carrier tapes 21 spliced according to the present embodiment have no right-angled steps at both ends A1 and A3 cut with the tapered portions, and at a butt joint A2 between the film carrier tapes, as illustrated in FIG. 7. Since the film carrier tape 21 is not caught in the guide members, it may be stably conveyed.

Moreover, since the cutting members 12 may be position adjusted to be rather narrowly spaced than the average film width, protrusion of the adhesive tape 24 from the film carrier tapes 12 may be reduced even if the films have varied widths that are rather smaller than the distance between the cutting members 12. Therefore, probability of the film carrier tapes being caught is reduced.

The angle α of the tapered portion 14 relative to the cutting direction extending in the longer direction of the film (FIG. 5) is in the range of 5 to 45°, preferably 10 to 30°, and more preferably 12 to 20°. The sloped surface 14a of the tapered portion may be a planar surface as shown in FIG. 5, or a smooth curve surface. The width W1 of the tapered portion 14 in the cutting direction extending in the longer direction of the film, that is, the width of the tapered portion in the cross section perpendicular to the height direction of the cutting member 12, is in the range of 20 μm to 5 mm, and preferably 100 μm to 1000 μm. The width W2 in the perpendicular depth direction is in the range of 20 μm to 500 μm, and preferably 30 μm to 100 μm.

Although the present invention has been explained by the above embodiment, it will be appreciated that the present invention is not limited to the embodiment and various modifications and alterations are possible within the scope of the invention. For example, although the above description explains the splice of film carrier tapes for mounting electronic components, the film splicer of the invention may be used for splicing other kinds of films in which sprocket holes are bored at given intervals along the longer direction and at both edge areas in the width direction of the films.

Moreover, the film splicer of the invention may be a double-side film splicer.

When the film carrier tapes on which electronic components are mounted should be spliced, the pressing plate 5 and the film pressing members 18 may be provided with appropriate openings to avoid contact with the electronic component mounted on the tapes.

While specific embodiments of the invention have been described in detail, it will be appreciated by those skilled in the art that various modifications and alternatives to those details could be developed in light of the overall teachings of the disclosure. The presently preferred embodiments described herein are meant to be illustrative only and not limiting as to the scope of the invention which is to be given the full breadth of the appended claims and any and all equivalents thereof.

What is claimed is:

1. A film splicer comprising:
    a base body on which two films to be spliced are aligned at predetermined positions such that splicing ends thereof make contact with each other;
    a splicer arm that is supported by a shaft to a base end portion of the base body and is rotatable toward and away from the base body;
    a pressing plate provided on the lower surface side of the splicer arm, the pressing plate being capable of pressing an adhesive tape and the films when the splicer arm is folded on the films on the base body, the adhesive tape being applied over the splicing ends of the films so as to splice these ends;
    a pair of punching members that are protruded downward from the pressing plate to penetrate the adhesive tape to bore sprocket holes when the splicer arm is folded on the films on the base body; and
    a pair of cutting members that are protruded downward from the pressing plate to cut the adhesive tape to a length in the width direction of the films when the splicer arm is folded on the films on the base body;
    wherein the cutting members are punches that are capable of punching out both the adhesive tape and excessive edge areas in the width direction of the films and that are formed with tapered portions having an angle relative to a cutting direction that extends in the longer direction of the films, the tapered portions being formed at both end areas in the cutting direction, wherein the tapered portions are configured to punch out the adhesive tape and excessive edge areas in the width direction of the films at an angle of between 5 and 45° relative to the longitudinal direction of the films.

2. The film splicer of claim 1, wherein the tapered portions are configured to punch out the adhesive tape and excessive edge areas in the width direction of the films at an angle of between 10 and 30° relative to the longitudinal direction of the films.

3. The film splicer of claim 1, wherein the tapered portions are configured to punch out the adhesive tape and excessive edge areas in the width direction of the films at an angle of between 12 and 20° relative to the longitudinal direction of the films.

* * * * *